United States Patent
Sakurai et al.

(10) Patent No.: US 6,828,726 B2
(45) Date of Patent: Dec. 7, 2004

(54) DISPLAY PANEL HAVING LIGHT-EMISSION ELEMENT WITHIN AN OPENING FORMED OF INSULATING LAYERS

(75) Inventors: Hiroyuki Sakurai, Fukaya (JP);
Michiya Kobayashi, Fukaya (JP);
Norihiko Kamiura, Konosu (JP);
Yoshiro Aoki, Kitamoto (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 134 days.

(21) Appl. No.: 09/981,888

(22) Filed: Oct. 19, 2001

(65) Prior Publication Data

US 2002/0047514 A1 Apr. 25, 2002

(30) Foreign Application Priority Data

Oct. 20, 2000 (JP) ........................................ 2000-321596

(51) Int. Cl.[7] ........................... H01J 63/04; H05B 33/20
(52) U.S. Cl. ....................... 313/506; 313/499; 313/498; 313/504; 313/503; 313/505; 313/512; 315/169.3; 438/159; 427/64; 427/66
(58) Field of Search ................................. 313/498, 499, 313/500–506, 512; 315/169.3; 438/159; 427/66, 68

(56) References Cited

U.S. PATENT DOCUMENTS

| | | | | |
|---|---|---|---|---|
| 5,526,149 A | * | 6/1996 | Kanbe et al. | ................ 349/113 |
| 5,855,804 A | * | 1/1999 | Walker | ......................... 216/89 |
| 6,246,179 B1 | * | 6/2001 | Yamada | ................... 315/169.3 |
| 6,380,672 B1 | * | 4/2002 | Yudasaka | ..................... 313/504 |
| 6,597,121 B2 | * | 7/2003 | Imura | ....................... 315/169.3 |

FOREIGN PATENT DOCUMENTS

| | | | | |
|---|---|---|---|---|
| JP | 02060088 A | * | 2/1990 | ........... H05B/33/04 |
| JP | 8-234683 | | 9/1996 | |
| JP | 11-24604 | | 1/1999 | |
| JP | 11-74082 | | 3/1999 | |
| JP | 11-271753 | | 10/1999 | |

* cited by examiner

Primary Examiner—Vip Patel
Assistant Examiner—Sikha Roy
(74) Attorney, Agent, or Firm—Pillsbury Winthrop LLP

(57) ABSTRACT

An organic EL display device comprises an organic EL element PX in which a self light-emitting layer is held between an anode and a cathode, and a pixel switch SW' for pixels formed of the organic EL element PX. Particularly, the pixel switch SW' includes a source electrode and a drain electrode which is formed together with the anode on an interlayer insulating film so as to reflect the light laterally emitted from the self light-emitting layer.

5 Claims, 3 Drawing Sheets

DISPLAY PANEL HAVING LIGHT-EMISSION ELEMENT WITHIN AN OPENING FORMED OF INSULATING LAYERS

CROSS-REFERENCE TO RELATED APPLICATIONS

This application is based upon and claims the benefit of priority from the prior Japanese Patent Application No. 2000-321596, filed Oct. 20, 2000, the entire contents of which are incorporated herein by reference.

BACKGROUND OF THE INVENTION

1. Field of the Invention

The present invention relates to a light-emission display panel for displaying an image by using a plurality of self light-emission elements and to a method of manufacturing the light-emission display panel.

2. Description of the Related Art

In recent years, a light-emission display panel such as an organic EL (Electro Luminescence) display device has attracted attention as a monitor display for a notebook type personal computer, a mobile information terminal or the like because the light-emission display panel is lightweight, thin and high in brightness. A typical organic EL display device is configured to display an image with a matrix array of organic EL elements used as pixels. In the organic EL display device, a plurality of scanning lines are arranged along the rows of these organic EL elements, and a plurality of signal lines are arranged along the columns of these organic EL elements. Further, a plurality of pixel switches are arranged near the intersections of the scanning lines and the signal lines. Each of the pixel switches applies a signal voltage from a corresponding signal line to a corresponding organic EL element when the pixel switch is driven through a corresponding scanning line.

FIG. 5 shows the pixel portion structure of the organic EL display device. As shown in the drawing, the organic EL element comprises a structure in which a light-emitting layer 1 is formed of a thin film containing an electro-luminescence-organic-compound of red, green or blue, and interposed between a cathode 2 and an anode 3. Electrons and holes are supplied into the light-emitting layer 1 and recombined so as to produce excitons. The light is emitted from the light-emitting layer when the excitons are deactivated. It should be noted that a buffer layer 4 is arranged between the light-emitting layer 1 and the anode 3 so as to produce the excitons efficiently. The anode 3 is a transparent electrode formed of, for example, ITO (Indium Tin Oxide), and the cathode 2 is a reflection electrode formed of a metal such as aluminum. Because of the particular construction, the organic EL element is capable of producing a brightness of about 100 to 100,000 cd/m$^2$ by the application of a voltage not higher than 10V.

The pixel switch is formed of, for example, a thin film transistor. The thin film transistor comprises a semiconductor thin film 6 formed on a glass substrate 5, a gate insulating film 7 covering the semiconductor thin film 6, a gate electrode 8 formed on the semiconductor thin film 6 with the gate insulating film 7 interposed therebetween, and source and drain electrodes 10 and 11 connected to the source and drain regions, respectively, formed on both sides of the gate electrode 8. The semiconductor thin film 6 is formed of, for example, amorphous silicon or polysilicon. The gate electrode 8 and the semiconductor thin film 6 are covered with an interlayer insulating film 9 formed with contact holes exposing the source and drain regions. The source electrode 10 and the drain electrode 11 are formed on the interlayer insulating film 9 in contact with the source and drain regions of the semiconductor thin film via the contact holes. Also, the source electrode 10 and the drain electrode 11 are covered with an interlayer insulating film 12 formed with a contact hole exposing the source electrode 10.

It should be noted that the thin film of the electro-luminescence-organic-compound tends to absorb moisture, and thereby becomes unusable. Thus, this thin film does not have a resistance to a photolithographic patterning process, for example. In the process of forming the organic EL element, the anode 3 is formed on the interlayer insulating film 12 in contact with the source electrode 10 via the contact hole of the interlayer insulating film 12. The anode 3 and the interlayer insulating film 12 are covered entirely with a protective film 13, and the protective layer 13 is covered entirely with an insulating film 14. The protective film 13 and the insulating film 14 are patterned to form an opening which exposes part of the anode 3. The buffer layer 4 is formed of a buffer material coated to cover the exposed portion of the anode 3 in the opening. The light-emitting layer 1 is formed of an electro-luminescence-organic-compound coated on the buffer layer 4. Further, the cathode 2 is formed on the light-emitting layer 1 by means of vapor deposition of a metal.

In a case where the organic EL element is formed through the steps described above, it is, however, necessary for the light emitted from the light-emitting layer 1 to pass through the interlayer insulating film 9 and the interlayer insulating film 12 for illuminating the outer space of the glass plate 5. As a result, the light transmittance is lowered.

BRIEF SUMMARY OF THE INVENTION

An object of the present invention is to provide a light-emission display panel with an excellent light-emitting property without requiring a complicated manufacturing process.

According to a first aspect of the present invention, there is provided a light-emission display panel, which comprises self light-emission elements in which a self light-emitting layer is held between first and second electrodes, and pixel wiring members for pixels formed of the self light-emission elements, wherein the first electrode having a light transmitting property, and each pixel wiring member includes metal wirings which are formed together with the first electrode in the same plane over a light transmitting dielectric plate to reflect the light emitted laterally from the self light-emitting layer.

According to a second aspect of the present invention, there is provided a light-emission display panel, which comprises self light-emission elements in which a self light-emitting layer is held between a transparent electrode and a reflection electrode, pixel wiring members for pixels formed of the self light-emission elements, and an insulating member which includes an interlayer insulating film covering the pixel wiring member and the transparent electrode and a water repellent insulating film covering the interlayer insulating film, wherein the self light-emitting layer is formed within an opening of the insulating member which is tapered toward and exposes part of the transparent electrode.

According to a third aspect of the present invention, there is provided a method of manufacturing a light-emission display panel having a matrix array of self light-emission elements in which a self light-emitting layer is held between a transparent electrode and a reflection electrode and a light is externally radiated through the transparent electrode, the method comprising formation of a semiconductor layer in an island form on a transparent dielectric plate, formation of a gate electrode on the semiconductor layer via a gate insulating film, formation of an interlayer insulating film on the gate insulating film and the gate electrode, formation of the transparent electrode on a selected area of the interlayer insulating film, and formation of a metal electrode which contacts the semiconductor layer via an opening formed in the interlayer insulating film and the gate insulating film after formation of the transparent electrode.

With the light-emission display panel according to the first aspect of the present invention, the metal wiring is formed together with the first electrode in the same plane over a light transmitting dielectric plate to reflect the light emitted laterally from the self light-emitting layer. This permits an increase in the intensity of the light radiated to the outside of the light transmitting dielectric plate. Further, since the metal wiring and the first electrode are formed in the same plane, it is unnecessary to form two light transmitting dielectric layers by independent processes. In addition, the light transmittance is prevented from being lowered due to an overlap of the two light transmitting dielectric layers.

With the light-emission display panel according to the second aspect of the present invention, the insulating film is covered with the water repellent insulating film to impart water-repellent properties to the inner wall of the opening on a side apart from the exposed surface of the transparent electrode. It follows that, where a predetermined amount of an electro-luminescence-organic-compound, which is used as the material of the self light-emitting layer, is jetted into the opening by an ink jet process, the electro-luminescence-organic-compound is not attached to the water repellent part of the inner wall of the opening and, thus, flows down promptly. As a result, the self light-emitting layer of a uniform and sufficient thickness can be formed on the transparent electrode exposed by the opening.

In the method of manufacturing a light-emission display panel according to the third aspect of the present invention, the opening receiving the metal electrode, which contacts the semiconductor layer, is formed after formation of the transparent electrode and the metal electrode is formed in this order. Therefore, it can be prevented that the semiconductor layer surface suffers damage during formation of the transparent electrode. Moreover, it can be prevented that the metal electrode is undesirably processed by etchant used during formation of the transparent electrode.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the present invention, and together with the general description given above and the detailed description of the embodiments given below, serve to explain the principles of the present invention.

DETAILED DESCRIPTION OF THE INVENTION

An organic EL display device providing a light-emission display panel according to one embodiment of the present invention will now be described with reference to the accompanying drawings.

Figure 1:
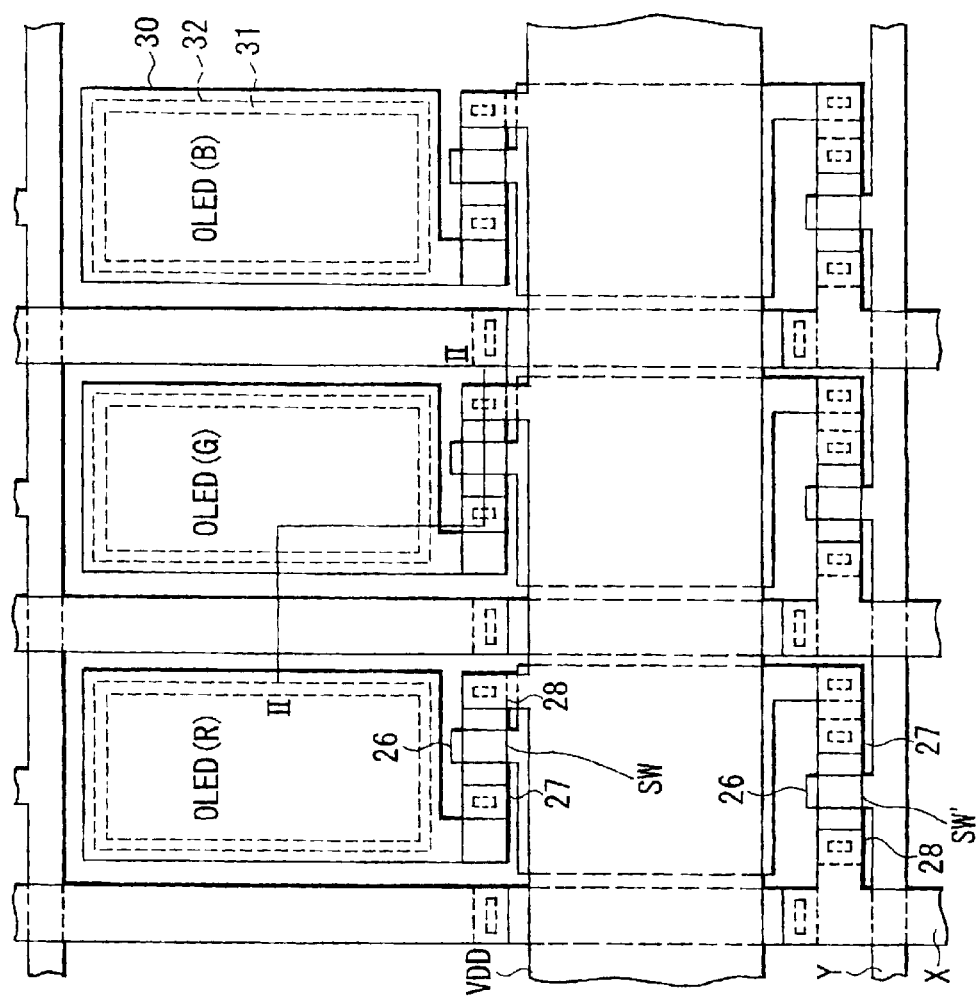
FIG. 1 is a plan view showing the pixel portion structure of the organic EL display device according to one embodiment of the present invention.
Figure 2:
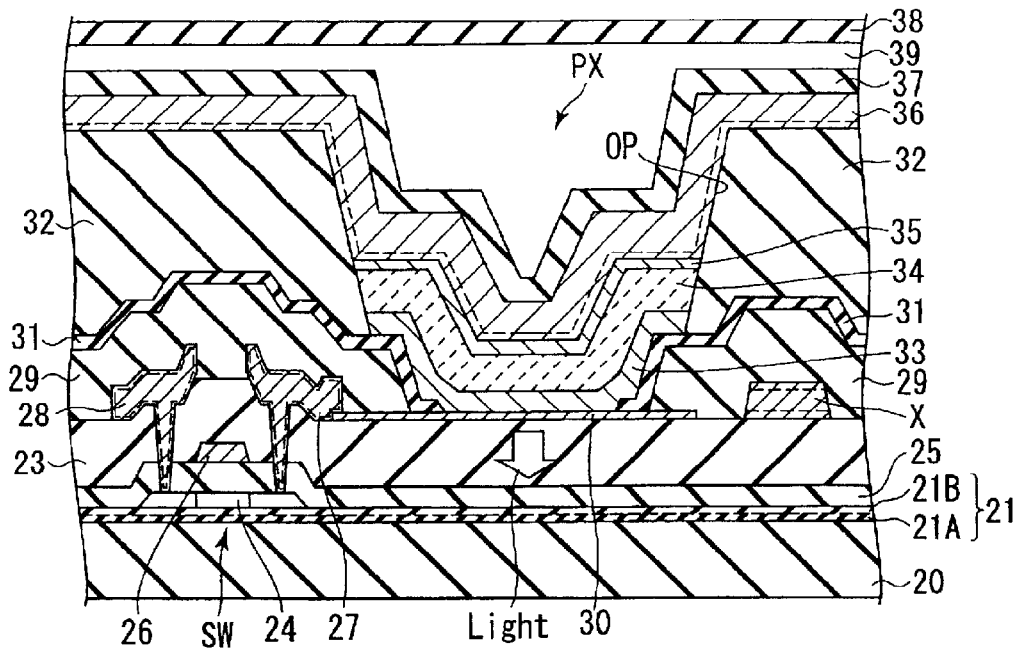
FIG. 2 is a cross sectional view along the line II—II shown in FIG. 1.

FIGS. 1 and 2 collectively show the pixel portion structure of the organic EL display device. The organic EL display device is configured to display an image by using organic EL elements PX arrayed in a matrix as pixels. In the organic EL display device, a plurality of scanning lines Y are arranged along the rows of these organic EL elements PX, and a plurality of signal lines X are arranged along the columns of these organic EL elements PX. Further, a plurality of pixel switches SW' are arranged near intersections of the scanning lines Y and the signal lines X. Each pixel switch SW' is driven via a corresponding scanning line Y and applies a signal voltage on a corresponding signal line to a driving element SW for a corresponding organic EL element. The driving element SW and the organic EL element are connected in series between a pair of power lines.

The organic EL element PX, the driving element SW and the pixel switch SW' are formed integral with a glass plate 20 used as a light transmitting dielectric substrate. The glass plate 20 is covered with an underlying layer 21 acting as a barrier for preventing silicon diffusion. The underlying layer 21 is of a multi-layered structure which includes a silicon nitride film 21A covering the glass plate 20 and a silicon oxide film 21B covering the silicon nitride film 21A.

The pixel switch SW' and the driving element SW are formed of, for example, thin film transistors. The thin film transistor comprises a semiconductor thin film 24 formed on the underlying layer 21, a gate insulating film 25 formed of silicon oxide and covering the semiconductor thin film 24, a gate electrode 26 formed above the semiconductor thin film 24 with the gate insulating film 25 interposed therebetween, and source and drain electrodes 27 and 28 connected respectively to source and drain regions doped with an impurity of a predetermined concentration and formed in the semiconductor thin film 24. The semiconductor thin film 24 is formed of amorphous silicon or polycrystalline silicon (polysilicon). The gate electrode 26 is formed of MoW. Further, each of the source electrode 27 and drain electrodes 28 is of a three-layered structure including metals such as Mo/Al/Mo. The gate electrode 26 and the semiconductor thin film 24 are covered with an interlayer insulating film 23 of silicon oxide and has contact holes exposing the source and drain regions. The source electrode 27 and the drain electrode 28 are formed on the interlayer insulating film 23 in contact with the source and drain regions of the semiconductor thin film 24 via the contact holes. The gate electrode 26 of the pixel switch SW' is formed as part of the scanning line, and the drain electrode 28 is formed as part of the signal line. The gate electrode of the driving element SW is connected to the source electrode of the pixel switch SW'.

Further, the drain electrode of the driving element SW is formed as part of a power source supply line VDD, and the source electrode is connected to the organic EL element PX.

The organic EL element PX is of a structure in which a self light-emitting layer is formed of at least a thin film containing an electro-luminescence-organic-compound of red, green or blue and interposed between a cathode 36 and an anode 30. Electrons and holes are supplied into the self light-emitting layer and recombined so as to produce excitons. Light is emitted from the self light-emitting layer when the excitons are deactivated. It should be noted that a buffer layer 33 is interposed between the light-emitting layer 34 and the anode 30, and an electron transfer layer 35 is interposed between the light-emitting layer 34 and the cathode 36 in order to form the excitons efficiently. In this embodiment, the structure of the light-emitting layer 34, the buffer layer 33 and the electron transfer layer 35 is used as a self light-emitting layer. Alternatively, the self light-emitting layer can be formed of a functional combination of two layers or a single layer. The anode 30 is a transparent electrode formed of, for example, ITO, and the cathode 36 is a reflection electrode of a two-layered structure including metals such as Ba/Ag. It should be noted that a transparent electrode is provided as, for example, the anode 30, so that the light is radiated through the transparent electrode. Alternatively, it is possible to provide the transparent electrode as the cathode and the reflection electrode as the anode.

In the formation process of the organic EL element, the anode 30 is formed on the interlayer insulating film 23 used as an underlayer, like the source electrode 27 and the drain electrode 28 of the thin film transistor. Incidentally, the source electrode 27 and the drain electrode 28 are formed after formation of the anode 30, thereby bringing the source electrode 27 into contact with the anode 30. Under this condition, a protective insulating film 29 of silicon nitride is formed to entirely cover the anode 30, the source electrode 27, the drain electrode 28, and the interlayer insulating film 23, and then patterned to partially expose the anode 30.

Since the contact hole is formed after formation of the anode 30, the surface of the semiconductor film 24 can be prevented from being damaged during the formation of the anode 30. Also, since the source electrode 27, the drain electrode 28 and the signal line X are formed after formation of the anode 30, the Mo/Al/Mo structure can be prevented from being undesirably etched by etchant for the ITO.

Thereafter, a hydrophilic insulating film 31 of silicon oxide is formed to entirely cover the protective insulating film 31 and the exposed part of the anode 30, and then patterned to partially expose the anode 30 again. Subsequently, a water repellent organic insulating film 32 of acrylic resin subjected to a surface treatment is formed to entirely cover the hydrophilic insulating film 31 and the exposed part of the anode 30, and then patterned to partially expose the anode 30 again. As a result of the patterning processes, an opening OP partially exposing the surface of the anode 30 and tapered toward the exposed surface is formed in an insulating member including the protective insulating film 29, the hydrophilic insulating film 31 and the water repellent organic insulating film 32.

After formation of the opening OP, a predetermined amount of water-soluble polymer solution is jetted into the opening OP by an ink jet process so as to form the buffer layer 33. Then, a predetermined amount of polymer solution containing electro-luminescence-organic-compound is jetted into the opening OP by an ink jet process so as to form the light-emitting layer 34. Thereafter, a predetermined amount of polymer solution is jetted into the opening OP by an ink jet process so as to form the electron transfer layer 35. Further, the water repellent insulating film 32 and the electron transfer layer 35 are covered with the cathode 36 formed by a vapor deposition of a metal. The cathode 36 is covered with a passivation layer 37 formed of SiN, AlN, or the like. Incidentally, it is possible to omit the electron transfer layer 35.

The resultant structure is coated with a sealing material applied along the outer periphery thereof, and is bonded to a support plate 38 such as a glass plate or a metal plate under a nitrogen gas atmosphere. As a result, nitrogen gas is sealed between the passivation layer 37 and the support plate 38.

In the embodiment described above, the source electrode 27, the drain electrode 28 and the signal line X are formed together with the anode 30 in the same plane on the interlayer insulating film 23 so as to reflect the light laterally emitted from the self light-emitting layer. This permits an increase in the intensity of the light radiated to the outside of the light transmitting dielectric substrate 20. Further, since the interlayer insulating film 23 serves as an underlayer common to the source and drain electrodes 27 and 28 and anode 30, it is unnecessary to form two interlayer insulating films by independent processes. In addition, the light transmittance is prevented from being lowered due to an overlap of the interlayer insulating films.

It should also be noted that, since the water repellent insulating film 32 covers the multi-layered structure including the protective insulating film 29 and the hydrophilic insulating film 31, it is possible to impart water repellent properties to the inner wall of the opening OP on a side apart from the exposed surface of the anode 30. It follows that, where a predetermined amount of an electro-luminescence-organic-compound, which is used as the material of the light-emitting layer 34, is jetted into the opening by an ink jet process, the electro-luminescence-organic-compound is not attached to the water repellent part of the inner wall of the opening OP and, thus, flows down promptly. This facilitates thickness control of the light-emitting layer 34. As a result, the light-emitting layer 34 of a uniform and sufficient thickness can be formed on the anode 30 exposed by the opening OP. This is also the case with the buffer layer 33 and the electron transfer layer 35.

The opening OP is formed through the multi-layered structure of the protective insulating film 29 and the hydrophilic insulating film 31. The inner wall of the opening OP is hydrophilic on a side closer to the exposed surface of the anode 30 than the water repellent insulating film 32 because of the presence of the hydrophilic insulating film 31. When the water repellent insulating film 32 repels the liquid electro-luminescence-organic-compound, the compound is reliably guided toward the exposed surface of the anode 30 by the hydrophilic insulating film 31.

Further, the multi-layered structure of the protective insulating film 29 and the hydrophilic insulating film 31 is obtained by entirely covering the protective insulating film 29 with the hydrophilic insulating film 31. Thus, a hydrophilic part can be easily provided on the inner wall of the opening in the structure.

Figure 3:
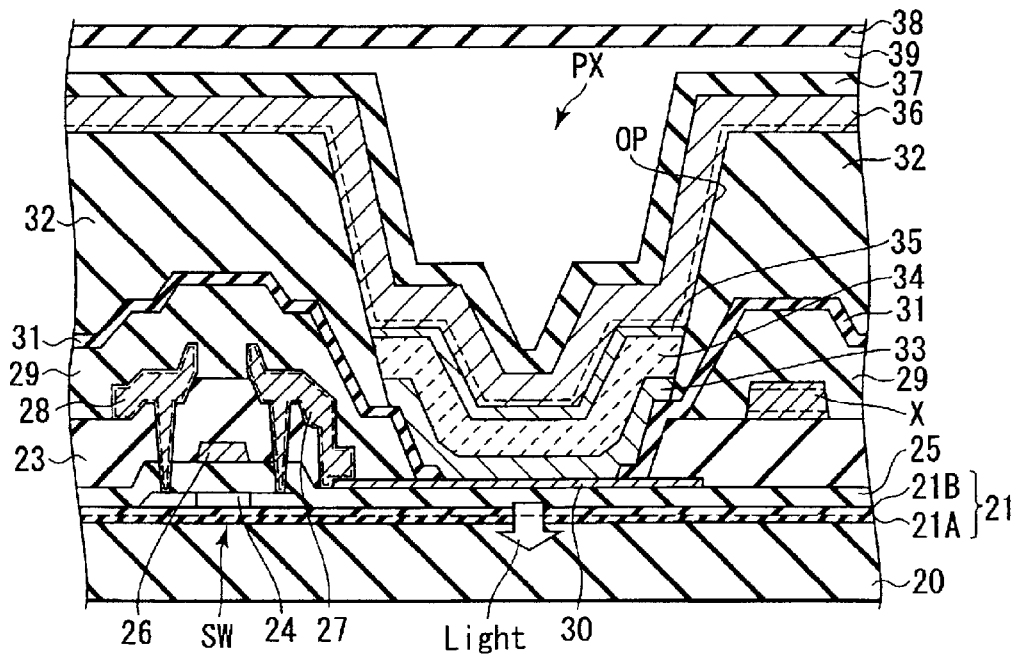
FIG. 3 is a cross sectional view showing a first modification of the pixel portion structure shown in FIG. 1.

The embodiment describes the case where the anode 30 is formed together with the source electrode 27, the drain electrode 28, and the signal line X in the same plane on the interlayer insulating film 23. The anode 30 may be formed in the same plane as the scanning line Y. For example, as shown in FIG. 3, the gate electrode 26, which is part of the scanning line Y, may be formed on the gate insulating film 25 together with anode 30 so as to reflect the light laterally emitted from the light-emitting layer 34. This permits an increase in the intensity of the light radiated to the outside of the light transmitting dielectric substrate 20 in the same manner as the structure shown in FIG. 2. Further, since the gate insulating film 25 serves as an underlayer common to the gate electrode 26 and the anode 30, it is unnecessary to form two insulating films by the independent processes. In addition, the light transmittance can be prevented from being lowered due to an overlap of the insulating films.

Figure 4:
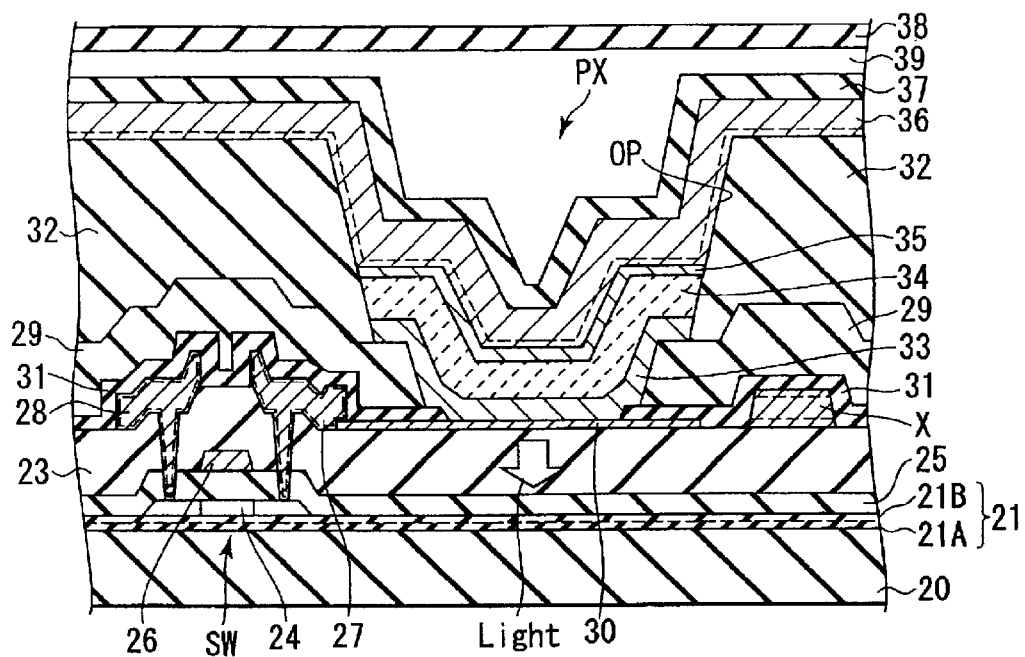
FIG. 4 is a cross sectional view showing a second modification of the pixel portion structure shown in FIG. 1.
Figure 5:
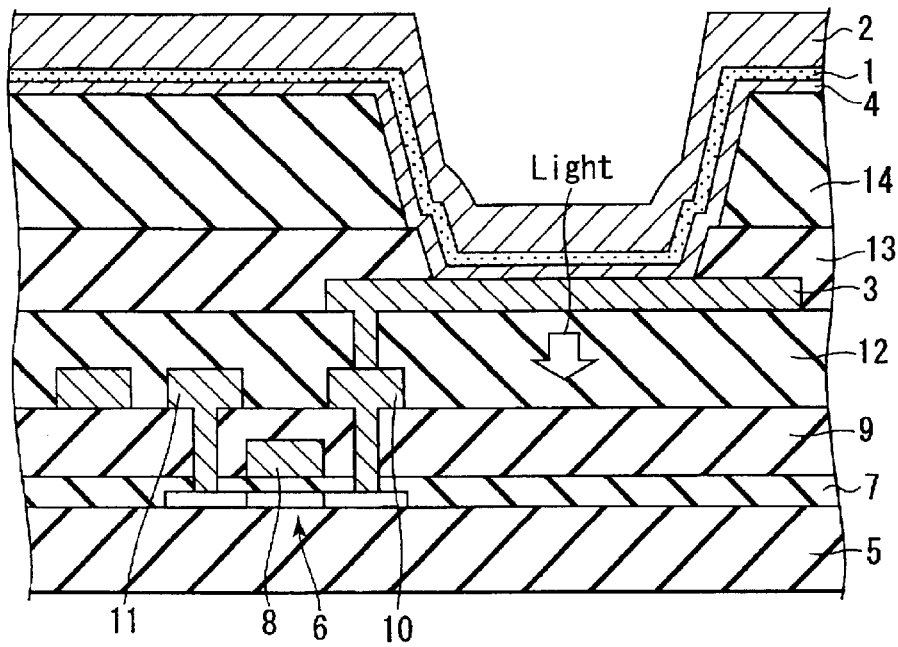
FIG. 5 is a cross sectional view showing the pixel portion structure of a conventional organic EL display device.

Moreover, the laminated structure of the protective insulating film 29 and the hydrophilic insulating film 31 may be formed as shown in FIG. 4, by covering the source electrode 27, the drain electrode 28 and the anode 30 with the hydrophilic insulating film 31, and covering only the upper surface of the hydrophilic insulating film 31 with the protective insulating film 29. Also in this case, a hydrophilic part can be easily provided to the inner wall of the opening OP in the structure.

In addition, a light reflecting wiring electrode made of a material differing from the material of the anode 30 may be used for suppressing disconnection at the stepped portion and an increase in the contact resistance so as to achieve reliable connections to the thin film transistor.

In the embodiment described above, a high molecular weight material is used as the material of the self light-emitting layer. Alternatively, it is also possible to use a low molecular weight material for forming the self light-emitting layer.

Also, in the embodiment described above, the organic EL element PX is used as a self light-emitting element. However, the present invention is not limited to this particular construction. In other words, the present invention is applicable to any self light-emission display panel in which a self light-emitting layer is held between a pair of electrodes facing each other.

Additional advantages and modifications will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A light-emission display panel, comprising:
   self light-emission elements, each of which includes a self light-emitting layer held between a light-transmitting electrode and a light-reflecting electrode;
   pixel wiring members for pixels formed of said self light-emission elements; and
   an insulating member covering said pixel wiring member and the light-transmitting electrode;
   each self light-emission layer being disposed within an opening which is formed in said insulating member to expose part of the light-transmitting electrode, said insulating member including a water repellent portion and hydrophilic portion which serve as an inner wall defining said opening, and said hydrophilic portion being arranged between said water repellent portion and the light-transmitting electrode and forming a shoulder that protrudes to a position closer to the center of said opening than said water repellent portion and that is covered with the self light-emission layer.

2. A light-emission display panel according to claim 1, wherein each pixel wiring member includes metal wirings which are formed together with said light-transmitting electrode in the same plane over a light-transmitting dielectric substrate to reflect light emitted laterally from said self light-emitting layer.

3. A light-emission display panel according to claim 1, wherein said insulating member includes an insulating film covering said pixel wiring member and said light-transmitting electrode and a water repellent insulating film covering said insulating film, said water repellent portion is part of said water repellent insulating film, and said hydrophilic portion is part of said insulating film.

4. A light-emission display panel according to claim 3, wherein said insulating film is of a multi-layered structure including protective insulating film and a hydrophilic insulating film.

5. A light-emission display panel according to claim 1, wherein said opening is tapered toward the part of said light-transmitting electrode.

* * * * *